(12) United States Patent
Wehrly, Jr.

(10) Patent No.: US 7,508,058 B2
(45) Date of Patent: Mar. 24, 2009

(54) STACKED INTEGRATED CIRCUIT MODULE

(75) Inventor: James Douglas Wehrly, Jr., Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 0 days.

(21) Appl. No.: 11/330,307

(22) Filed: Jan. 11, 2006

(65) Prior Publication Data

US 2007/0170561 A1 Jul. 26, 2007

(51) Int. Cl.
H01L 23/02 (2006.01)
H01L 23/48 (2006.01)
H01L 23/52 (2006.01)
H01L 23/34 (2006.01)
H01L 23/04 (2006.01)
H01L 29/40 (2006.01)

(52) U.S. Cl. .................. 257/686; 257/685; 257/688; 257/692; 257/723; 257/730; 257/777; 257/778; 257/E27.137; 257/E27.144; 257/E27.161

(58) Field of Classification Search ......... 257/685–686, 257/688, 692, 723, 730, 777, 778, E27.137, 257/E27.144, E27.161
See application file for complete search history.

(56) References Cited

U.S. PATENT DOCUMENTS

| 3,436,604 | A | 4/1969 | Hyltin | 361/715 |
|---|---|---|---|---|
| 3,654,394 | A | 4/1972 | Gordon | 370/534 |
| 3,704,455 | A | 11/1972 | Scarbrough | 365/52 |
| 3,746,934 | A | 7/1973 | Stein | 361/810 |
| 3,766,439 | A | 10/1973 | Isaacson | 361/714 |
| 3,772,776 | A | 11/1973 | Weisenburger | 29/830 |
| 3,983,547 | A | 9/1976 | Almasi | 365/2 |
| 4,288,841 | A | 9/1981 | Gogal | 361/792 |
| 4,398,235 | A | 8/1983 | Lutz et al. | 361/735 |
| 4,406,508 | A | 9/1983 | Sadigh-Behzadi | 439/69 |
| 4,437,235 | A | 3/1984 | McIver | 29/840 |

(Continued)

OTHER PUBLICATIONS

Demmin, J.C., et al. "Stacked Chip Scale Packages: Manufacturing Issues, Reliabilty Results, and Costs Analysis," International Electionics Manufacturing Technology Symposium, San Jose, California, Jul. 17, 2003, [retrieved Oct. 22, 2007 Retrieved from the Internet. <URL: http://www.touchbriefings.com/pdf/23/gsc032_t_tessera.pdf>, entire document (especially p. 2, col. 1, para 1-2 and fig 1).

(Continued)

Primary Examiner—Ida M Soward
(74) Attorney, Agent, or Firm—Fish & Richardson P.C.

(57) ABSTRACT

The present invention provides an improvement on the use of flexible circuit connectors for electrically coupling IC devices to one another in a stacked configuration by use of the flexible circuit to provide the connection of the stacked IC module to other circuits. Use of the flexible circuit as the connection of the IC module allows the flexible circuit to provide strain relief and allows stacked IC modules to be assembled with a lower profile than with previous methods. The IC module can be connected to external circuits through the flexible circuit connectors by a variety of means, including solder pads, edge connector pads, and socket connectors. This allows for IC devices to occupy less space then with previous methods, which is beneficial in modules such as memory modules with multiple, stacked memory devices.

14 Claims, 10 Drawing Sheets

U.S. PATENT DOCUMENTS

| | | | |
|---|---|---|---|
| 4,513,368 A | 4/1985 | Houseman | 711/5 |
| 4,567,543 A | 1/1986 | Miniet | 361/749 |
| 4,587,596 A | 5/1986 | Bunnell | 361/749 |
| 4,645,944 A | 2/1987 | Uya | 327/410 |
| 4,656,605 A | 4/1987 | Clayton | 365/52 |
| 4,682,207 A | 7/1987 | Akasaki et al. | 257/700 |
| 4,696,525 A | 9/1987 | Coller et al. | 439/69 |
| 4,709,300 A | 11/1987 | Landis | 361/750 |
| 4,733,461 A | 3/1988 | Nakano | 29/830 |
| 4,758,875 A | 7/1988 | Fujisawa et al. | 257/792 |
| 4,763,188 A | 8/1988 | Johnson | 257/777 |
| 4,821,007 A | 4/1989 | Fields et al. | 333/238 |
| 4,823,234 A | 4/1989 | Konishi et al. | 361/718 |
| 4,833,568 A | 5/1989 | Berhold | 361/690 |
| 4,850,892 A | 7/1989 | Clayton et al. | 439/326 |
| 4,862,249 A | 8/1989 | Carlson | 257/668 |
| 4,884,237 A | 11/1989 | Mueller et al. | 365/63 |
| 4,891,789 A | 1/1990 | Quattrini et al. | 365/63 |
| 4,894,706 A | 1/1990 | Sato et al. | 361/770 |
| 4,911,643 A | 3/1990 | Perry et al. | 439/67 |
| 4,953,060 A | 8/1990 | Lauffer et al. | 361/710 |
| 4,956,694 A | 9/1990 | Eide | 257/686 |
| 4,972,580 A | 11/1990 | Nakamura | 29/840 |
| 4,982,265 A | 1/1991 | Watanabe et al. | 257/737 |
| 4,983,533 A | 1/1991 | Go | 438/12 |
| 4,985,703 A | 1/1991 | Kaneyama | 341/141 |
| 5,012,323 A | 4/1991 | Farnworth | 257/727 |
| 5,016,138 A | 5/1991 | Woodman | 361/688 |
| 5,025,306 A | 6/1991 | Johnson et al. | 257/700 |
| 5,034,350 A | 7/1991 | Marchisi | 29/827 |
| 5,041,015 A | 8/1991 | Travis | 493/492 |
| 5,050,039 A | 9/1991 | Edfors | 361/710 |
| 5,053,853 A | 10/1991 | Haj-Ali-Ahmadi et al. | 257/693 |
| 5,065,277 A | 11/1991 | Davidson | 361/689 |
| 5,081,067 A | 1/1992 | Shimizu et al. | 228/123.1 |
| 5,099,393 A | 3/1992 | Bentlage et al. | 361/785 |
| 5,104,820 A | 4/1992 | Go et al. | 438/109 |
| 5,117,282 A | 5/1992 | Salatino | 257/686 |
| 5,122,862 A | 6/1992 | Kajihara et al. | 257/704 |
| 5,138,430 A | 8/1992 | Gow et al. | 257/712 |
| 5,140,405 A | 8/1992 | King et al. | 257/727 |
| 5,159,434 A | 10/1992 | Kohno et al. | 257/676 |
| 5,159,535 A | 10/1992 | Desai et al. | 361/751 |
| 5,191,404 A | 3/1993 | Wu et al. | 257/724 |
| 5,198,888 A | 3/1993 | Sugano et al. | 257/686 |
| 5,198,965 A | 3/1993 | Curtis et al. | 361/717 |
| 5,208,729 A | 5/1993 | Cipolla et al. | |
| 5,219,794 A | 6/1993 | Satoh et al. | |
| 5,222,014 A | 6/1993 | Lin | |
| 5,224,023 A | 6/1993 | Smith et al. | |
| 5,229,916 A | 7/1993 | Frankeny et al. | |
| 5,229,917 A | 7/1993 | Harris et al. | |
| 5,239,198 A | 8/1993 | Lin et al. | |
| 5,241,454 A | 8/1993 | Ameen et al. | |
| 5,241,456 A | 8/1993 | Marcinkiewiez et al. | |
| 5,243,133 A | 9/1993 | Engle et al. | |
| 5,247,423 A | 9/1993 | Lin et al. | |
| 5,252,857 A | 10/1993 | Kane et al. | |
| 5,253,010 A | 10/1993 | Oku et al. | |
| 5,259,770 A | 11/1993 | Bates et al. | |
| 5,261,068 A | 11/1993 | Gaskins et al. | |
| 5,262,927 A | 11/1993 | Chia et al. | |
| 5,268,815 A | 12/1993 | Cipolla et al. | |
| 5,276,418 A | 1/1994 | Klosowiak et al. | |
| 5,279,029 A | 1/1994 | Burns | |
| 5,281,852 A | 1/1994 | Normington | |
| 5,289,062 A | 2/1994 | Wyland | |
| 5,289,346 A | 2/1994 | Carey et al. | |
| 5,311,401 A | 5/1994 | Gates et al. | |
| 5,313,096 A | 5/1994 | Eide | |
| 5,313,097 A | 5/1994 | Haj-Ali-Ahmadi et al. | |
| 5,343,075 A | 8/1994 | Nishino | |
| 5,345,205 A | 9/1994 | Kornrumpf | |
| 5,347,428 A | 9/1994 | Carson et al. | |
| 5,361,228 A | 11/1994 | Adachi et al. | |
| 5,375,041 A | 12/1994 | McMahon | |
| 5,377,077 A | 12/1994 | Burns | |
| 5,386,341 A | 1/1995 | Olson et al. | |
| 5,390,844 A | 2/1995 | Distefano et al. | |
| 5,394,010 A | 2/1995 | Tazawa et al. | |
| 5,394,300 A | 2/1995 | Yoshimura | |
| 5,394,303 A | 2/1995 | Yamaji | |
| 5,397,916 A | 3/1995 | Normington | |
| 5,400,003 A | 3/1995 | Kledzik | |
| 5,402,006 A | 3/1995 | O'Donley | |
| 5,420,751 A | 5/1995 | Burns | |
| 5,422,435 A | 6/1995 | Takiar et al. | |
| 5,428,190 A | 6/1995 | Stopperan | |
| 5,438,224 A | 8/1995 | Papageorge et al. | |
| 5,446,620 A | 8/1995 | Burns et al. | |
| 5,448,511 A * | 9/1995 | Paurus et al. | 365/52 |
| 5,455,740 A | 10/1995 | Burns | |
| 5,475,920 A | 12/1995 | Burns et al. | |
| 5,477,082 A | 12/1995 | Buckley et al. | |
| 5,484,959 A | 1/1996 | Burns | |
| 5,491,612 A | 2/1996 | Nicewarner et al. | |
| 5,499,160 A | 3/1996 | Burns | |
| 5,502,333 A | 3/1996 | Bertin et al. | |
| 5,514,907 A | 5/1996 | Moshayedi | |
| 5,523,619 A | 6/1996 | McAllister et al. | |
| 5,523,695 A | 6/1996 | Lin | |
| 5,548,091 A | 8/1996 | DiStefano et al. | |
| 5,552,631 A | 9/1996 | McCormick | |
| 5,561,591 A | 10/1996 | Burns | |
| 5,566,051 A | 10/1996 | Burns | |
| 5,572,065 A | 11/1996 | Burns | |
| 5,579,207 A | 11/1996 | Hayden et al. | |
| 5,588,205 A | 12/1996 | Roane | |
| 5,592,364 A | 1/1997 | Roane | |
| 5,594,275 A | 1/1997 | Kwon et al. | |
| 5,600,541 A | 2/1997 | Bone et al. | |
| 5,612,570 A | 3/1997 | Eide et al. | |
| 5,625,221 A | 4/1997 | Kim et al. | |
| 5,631,807 A | 5/1997 | Griffin | |
| 5,642,055 A | 6/1997 | Difrancesco | |
| 5,644,161 A | 7/1997 | Burns | |
| 5,646,446 A * | 7/1997 | Nicewarner et al. | 257/723 |
| 5,654,877 A | 8/1997 | Burns | |
| 5,657,537 A | 8/1997 | Saia et al. | |
| 5,659,952 A | 8/1997 | Kovac et al. | |
| 5,677,566 A | 10/1997 | King et al. | |
| 5,677,569 A | 10/1997 | Choi et al. | |
| 5,714,802 A | 2/1998 | Cloud et al. | |
| 5,715,144 A | 2/1998 | Ameen et al. | |
| 5,729,894 A | 3/1998 | Rostoker et al. | |
| 5,744,862 A | 4/1998 | Ishii | |
| 5,751,553 A | 5/1998 | Clayton | |
| 5,754,409 A | 5/1998 | Smith | |
| 5,764,497 A | 6/1998 | Mizumo | |
| 5,776,797 A | 7/1998 | Nicewarner et al. | |
| 5,778,522 A | 7/1998 | Burns | |
| 5,783,464 A | 7/1998 | Burns | |
| 5,789,815 A | 8/1998 | Tessier et al. | |
| 5,801,437 A | 9/1998 | Burns | |
| 5,801,439 A | 9/1998 | Fujisawa et al. | |
| 5,804,870 A | 9/1998 | Burns | |
| 5,805,422 A | 9/1998 | Otake et al. | |
| 5,805,424 A | 9/1998 | Purinton | |
| 5,811,879 A | 9/1998 | Akram | |
| 5,835,988 A | 11/1998 | Ishii | |
| 5,844,168 A | 12/1998 | Schueller et al. | |
| 5,861,666 A | 1/1999 | Bellaar | |
| 5,869,353 A | 2/1999 | Levy et al. | |
| 5,899,705 A | 5/1999 | Akram | |

| Patent | Kind | Date | Inventor |
|---|---|---|---|
| 5,917,242 | A | 6/1999 | Ball |
| 5,917,709 | A | 6/1999 | Johnson et al. |
| 5,925,934 | A | 7/1999 | Lim |
| 5,926,369 | A | 7/1999 | Ingraham et al. |
| 5,949,657 | A | 9/1999 | Karabatsos |
| 5,953,214 | A | 9/1999 | Dranchak et al. |
| 5,953,215 | A | 9/1999 | Karabatsos |
| 5,959,839 | A | 9/1999 | Gates |
| 5,963,427 | A | 10/1999 | Bolleson |
| 5,973,395 | A | 10/1999 | Suzuki et al. |
| 5,977,640 | A | 11/1999 | Bertin et al. |
| 5,995,370 | A | 11/1999 | Nakamori |
| 6,002,167 | A | 12/1999 | Hatano et al. |
| 6,002,589 | A | 12/1999 | Perino et al. |
| 6,013,948 | A | 1/2000 | Akram et al. |
| 6,014,316 | A | 1/2000 | Eide |
| 6,021,048 | A | 2/2000 | Smith |
| 6,025,642 | A | 2/2000 | Burns |
| 6,028,352 | A | 2/2000 | Eide |
| 6,028,358 | A | 2/2000 | Suzuki |
| 6,028,365 | A | 2/2000 | Akram et al. |
| 6,030,856 | A | 2/2000 | DiStefano et al. |
| 6,034,878 | A | 3/2000 | Osaka et al. |
| 6,040,624 | A | 3/2000 | Chambers et al. |
| 6,072,233 | A | 6/2000 | Corisis et al. |
| 6,080,264 | A | 6/2000 | Ball |
| 6,084,293 | A | 7/2000 | Ohuchi |
| 6,084,294 | A | 7/2000 | Tomita |
| 6,084,778 | A | 7/2000 | Malhi |
| 6,091,145 | A | 7/2000 | Clayton |
| 6,097,087 | A | 8/2000 | Farnworth et al. |
| 6,104,089 | A | 8/2000 | Akram |
| 6,121,676 | A | 9/2000 | Solberg |
| RE36,916 | E | 10/2000 | Moshayedi |
| 6,133,640 | A | 10/2000 | Leedy |
| 6,137,164 | A | 10/2000 | Yew et al. |
| 6,157,541 | A | 12/2000 | Hacke |
| 6,166,443 | A | 12/2000 | Inaba et al. |
| 6,172,418 | B1 | 1/2001 | Iwase |
| 6,172,874 | B1 | 1/2001 | Bartilson |
| 6,180,881 | B1 | 1/2001 | Isaak |
| 6,187,652 | B1 | 2/2001 | Chou et al. |
| 6,205,654 | B1 | 3/2001 | Burns |
| 6,208,571 | B1 | 3/2001 | Ikeda et al. |
| 6,214,641 | B1 | 4/2001 | Akram |
| 6,222,737 | B1 | 4/2001 | Ross |
| 6,222,739 | B1 | 4/2001 | Bhakta et al. |
| 6,225,688 | B1 | 5/2001 | Kim et al. |
| 6,232,659 | B1 | 5/2001 | Clayton |
| 6,233,650 | B1 | 5/2001 | Johnson et al. |
| 6,234,820 | B1 | 5/2001 | Perino et al. |
| 6,239,496 | B1 | 5/2001 | Asada |
| 6,262,476 | B1 | 7/2001 | Vidal |
| 6,262,895 | B1 | 7/2001 | Forthun |
| 6,265,660 | B1 | 7/2001 | Tandy |
| 6,265,766 | B1 | 7/2001 | Moden |
| 6,266,252 | B1 | 7/2001 | Karabatsos |
| 6,268,649 | B1 | 7/2001 | Corisis et al. |
| 6,281,577 | B1 | 8/2001 | Oppermann et al. |
| 6,288,924 | B1 | 9/2001 | Sugano et al. |
| 6,294,406 | B1 | 9/2001 | Bertin et al. |
| 6,300,163 | B1 | 10/2001 | Akram |
| 6,300,679 | B1 | 10/2001 | Mukerji et al. |
| 6,303,981 | B1 | 10/2001 | Moden |
| 6,303,997 | B1 | 10/2001 | Lee |
| 6,310,392 | B1 | 10/2001 | Burns |
| 6,313,522 | B1 | 11/2001 | Akram et al. |
| 6,313,998 | B1 | 11/2001 | Kledzik |
| 6,316,825 | B1 | 11/2001 | Park et al. |
| 6,316,838 | B1 | 11/2001 | Ozawa et al. |
| 6,323,060 | B1 | 11/2001 | Isaak |
| 6,329,708 | B1 | 12/2001 | Komiyama |
| 6,329,713 | B1 | 12/2001 | Farquhar et al. |
| 6,336,262 | B1 | 1/2002 | Dalal et al. |
| 6,339,254 | B1 | 1/2002 | Venkateshwaran et al. |
| 6,351,029 | B1 | 2/2002 | Isaak |
| 6,360,433 | B1 | 3/2002 | Ross |
| 6,368,896 | B2 | 4/2002 | Farnworth et al. |
| 6,376,769 | B1 | 4/2002 | Chung |
| 6,388,333 | B1 | 5/2002 | Taniguchi et al. |
| 6,392,162 | B1 | 5/2002 | Karabatsos |
| 6,392,953 | B1 | 5/2002 | Yamada et al. |
| 6,404,043 | B1 | 6/2002 | Isaak |
| 6,404,049 | B1 | 6/2002 | Shibamoto et al. |
| 6,410,857 | B1 | 6/2002 | Gonya |
| 6,414,384 | B1 | 7/2002 | Lo et al. |
| 6,426,240 | B2 | 7/2002 | Isaak |
| 6,426,549 | B1 | 7/2002 | Isaak |
| 6,428,360 | B1 | 8/2002 | Hassanzadeh |
| 6,433,418 | B1 | 8/2002 | Fujisawa et al. |
| 6,437,990 | B1 | 8/2002 | Degani et al. |
| 6,444,490 | B2 | 9/2002 | Bertin et al. |
| 6,444,921 | B1 | 9/2002 | Wang et al. |
| 6,446,158 | B1 | 9/2002 | Karabatsos |
| 6,449,159 | B1 | 9/2002 | Haba |
| 6,452,826 | B1 | 9/2002 | Kim et al. |
| 6,462,408 | B1 | 10/2002 | Wehrly, Jr. |
| 6,462,412 | B2 | 10/2002 | Kamei et al. |
| 6,462,421 | B1 | 10/2002 | Hsu et al. |
| 6,465,877 | B1 | 10/2002 | Farnworth et al. |
| 6,465,893 | B1 | 10/2002 | Khandros et al. |
| 6,472,735 | B2 | 10/2002 | Isaak |
| 6,473,308 | B2 | 10/2002 | Forthun |
| 6,486,544 | B1 | 11/2002 | Hashimoto |
| 6,489,178 | B2 | 12/2002 | Coyle et al. |
| 6,489,687 | B1 | 12/2002 | Hashimoto |
| 6,492,718 | B2 | 12/2002 | Ohmori |
| 6,504,104 | B2 | 1/2003 | Hacke et al. |
| 6,509,639 | B1 | 1/2003 | Lin |
| 6,514,793 | B2 | 2/2003 | Isaak |
| 6,514,794 | B2 | 2/2003 | Haba et al. |
| 6,521,530 | B2 | 2/2003 | Peters et al. |
| 6,522,018 | B1 | 2/2003 | Tay et al. |
| 6,522,022 | B2 | 2/2003 | Murayama |
| 6,525,413 | B1 | 2/2003 | Cloud et al. |
| 6,528,870 | B2 | 3/2003 | Fukatsu et al. |
| 6,531,337 | B1 | 3/2003 | Akram et al. |
| 6,531,338 | B2 | 3/2003 | Akram et al. |
| 6,532,162 | B2 | 3/2003 | Schoenborn |
| 6,552,910 | B1 | 4/2003 | Moon et al. |
| 6,560,117 | B2 | 5/2003 | Moon |
| 6,563,217 | B2 | 5/2003 | Corisis et al. |
| 6,566,760 | B1 * | 5/2003 | Kawamura et al. .......... 257/777 |
| 6,572,387 | B2 | 6/2003 | Burns et al. |
| 6,573,593 | B1 | 6/2003 | Syri et al. |
| 6,576,992 | B1 | 6/2003 | Cady et al. |
| 6,583,502 | B2 | 6/2003 | Lee et al. |
| 6,590,282 | B1 * | 7/2003 | Wang et al. .................. 257/686 |
| 6,600,222 | B1 | 7/2003 | Levardo |
| 6,603,198 | B2 | 8/2003 | Akram et al. |
| 6,608,763 | B1 | 8/2003 | Burns et al. |
| 6,614,664 | B2 | 9/2003 | Lee |
| 6,620,651 | B2 | 9/2003 | He et al. |
| 6,627,984 | B2 | 9/2003 | Bruce et al. |
| 6,646,335 | B2 | 11/2003 | Emoto |
| 6,646,936 | B2 | 11/2003 | Hamamatsu |
| 6,650,588 | B2 | 11/2003 | Yamagata |
| 6,657,134 | B2 | 12/2003 | Spielberger et al. |
| 6,660,561 | B2 | 12/2003 | Forthun |
| 6,661,092 | B2 | 12/2003 | Shibata et al. |
| 6,673,651 | B2 | 1/2004 | Ohuchi et al. |
| 6,674,644 | B2 | 1/2004 | Schulz |
| 6,677,670 | B2 | 1/2004 | Kondo |
| 6,683,377 | B1 * | 1/2004 | Shim et al. .................. 257/723 |
| 6,686,656 | B1 | 2/2004 | Koh et al. |
| 6,690,584 | B2 | 2/2004 | Uzuka et al. |

| | | |
|---|---|---|
| 6,699,730 B2 | 3/2004 | Kim et al. |
| 6,707,684 B1 | 3/2004 | Andric et al. |
| 6,710,437 B2 | 3/2004 | Takahashi et al. |
| 6,712,226 B1 | 4/2004 | Woo et al. |
| 6,717,275 B2 * | 4/2004 | Matsuura et al. ............ 257/778 |
| 6,720,652 B2 | 4/2004 | Akram et al. |
| 6,726,346 B2 | 4/2004 | Shoji |
| 6,737,742 B2 | 5/2004 | Sweterlitsch |
| 6,737,891 B2 | 5/2004 | Karabatsos |
| 6,740,981 B2 | 5/2004 | Hosomi |
| 6,746,894 B2 | 6/2004 | Fee et al. |
| 6,756,661 B2 | 6/2004 | Tsuneda et al. |
| 6,759,737 B2 | 7/2004 | Seo et al. |
| 6,760,220 B2 | 7/2004 | Canter et al. |
| 6,765,288 B2 | 7/2004 | Damberg |
| 6,768,660 B2 | 7/2004 | Kong et al. |
| 6,774,475 B2 | 8/2004 | Blackshear et al. |
| 6,777,794 B2 | 8/2004 | Nakajima |
| 6,781,240 B2 | 8/2004 | Choi et al. |
| 6,788,560 B2 | 9/2004 | Sugano et al. |
| 6,798,057 B2 | 9/2004 | Bolkin et al. |
| 6,812,567 B2 | 11/2004 | Kim et al. |
| 6,815,818 B2 | 11/2004 | Moore et al. |
| 6,826,066 B2 | 11/2004 | Kozaru |
| 6,833,984 B1 | 12/2004 | Belgacem |
| 6,838,761 B2 | 1/2005 | Karnezos |
| 6,839,266 B1 | 1/2005 | Garrett et al. |
| 6,841,868 B2 | 1/2005 | Akram et al. |
| 6,849,949 B1 | 2/2005 | Lyu et al. |
| 6,850,414 B2 | 2/2005 | Benisek et al. |
| 6,853,064 B2 | 2/2005 | Bolken et al. |
| 6,858,910 B2 | 2/2005 | Coyle et al. |
| 6,869,825 B2 | 3/2005 | Chiu |
| 6,873,039 B2 | 3/2005 | Beroz et al. |
| 6,876,074 B2 | 4/2005 | Kim |
| 6,878,571 B2 | 4/2005 | Isaak et al. |
| 6,884,653 B2 | 4/2005 | Larson |
| 6,893,897 B2 | 5/2005 | Sweterlitsch |
| 6,897,565 B2 | 5/2005 | Pflughaupt et al. |
| 6,906,416 B2 | 6/2005 | Karnezos |
| 6,908,792 B2 | 6/2005 | Bruce et al. |
| 6,910,268 B2 | 6/2005 | Miller |
| 6,913,949 B2 | 7/2005 | Pflughaupt et al. |
| 6,914,324 B2 | 7/2005 | Rapport et al. |
| 6,919,626 B2 | 7/2005 | Burns |
| 6,927,471 B2 | 8/2005 | Salmon |
| 6,940,158 B2 | 9/2005 | Haba et al. |
| 6,940,729 B2 | 9/2005 | Cady et al. |
| 6,943,454 B1 | 9/2005 | Gulachenski et al. |
| 6,956,883 B2 | 10/2005 | Kamoto |
| 6,972,481 B2 | 12/2005 | Karnezos |
| 6,977,440 B2 | 12/2005 | Pflughaupt et al. |
| 6,977,441 B2 * | 12/2005 | Hashimoto ............ 257/777 |
| 6,978,538 B2 | 12/2005 | DiStefano et al. |
| 6,982,869 B2 * | 1/2006 | Larson ............ 361/684 |
| 6,989,285 B2 | 1/2006 | Ball |
| 7,011,981 B2 | 3/2006 | Kim et al. |
| 7,023,701 B2 | 4/2006 | Stocken et al. |
| 7,033,861 B1 * | 4/2006 | Partridge et al. ............ 438/109 |
| 7,053,485 B2 | 5/2006 | Bang et al. |
| 7,053,486 B2 | 5/2006 | Shizuno |
| 7,057,278 B2 | 6/2006 | Naka et al. |
| 7,061,088 B2 | 6/2006 | Karnezos |
| 7,061,121 B2 | 6/2006 | Haba |
| 7,061,122 B2 | 6/2006 | Kim et al. |
| 7,064,426 B2 | 6/2006 | Karnezos |
| 7,071,547 B2 | 7/2006 | Kang et al. |
| 7,078,793 B2 | 7/2006 | Ruckerbauer et al. |
| 7,102,221 B2 | 9/2006 | Miyamoto et al. |
| 7,109,576 B2 | 9/2006 | Bolken et al. |
| 7,115,982 B2 | 10/2006 | Moxham |
| 7,115,986 B2 | 10/2006 | Moon et al. |
| 7,122,886 B2 * | 10/2006 | Murayama et al. ............ 257/686 |
| 7,129,571 B2 | 10/2006 | Kang |
| 7,149,095 B2 | 12/2006 | Warner et al. |
| 7,161,237 B2 | 1/2007 | Lee |
| 2001/0013423 A1 | 8/2001 | Dalal et al. |
| 2001/0040793 A1 | 11/2001 | Inaba |
| 2002/0006032 A1 | 1/2002 | Karabatsos |
| 2002/0094603 A1 | 7/2002 | Isaak |
| 2002/0196612 A1 | 12/2002 | Gall et al. |
| 2003/0057540 A1 * | 3/2003 | Shieh ............ 257/686 |
| 2003/0064548 A1 | 4/2003 | Isaak |
| 2003/0090879 A1 | 5/2003 | Doblar et al. |
| 2003/0116835 A1 | 6/2003 | Miyamoto et al. |
| 2003/0159278 A1 | 8/2003 | Peddle |
| 2003/0168725 A1 * | 9/2003 | Warner et al. ............ 257/686 |
| 2004/0000707 A1 | 1/2004 | Roper et al. |
| 2004/0075991 A1 | 4/2004 | Haba et al. |
| 2004/0115866 A1 | 6/2004 | Bang et al. |
| 2004/0150107 A1 | 8/2004 | Cha et al. |
| 2004/0217461 A1 | 11/2004 | Damberg |
| 2004/0217471 A1 | 11/2004 | Haba |
| 2004/0238931 A1 * | 12/2004 | Haba et al. ............ 257/686 |
| 2004/0238936 A1 * | 12/2004 | Rumer et al. ............ 257/688 |
| 2004/0245617 A1 | 12/2004 | Damberg et al. |
| 2004/0267409 A1 | 12/2004 | De Lorenzo et al. |
| 2005/0018495 A1 | 1/2005 | Bhakta et al. |
| 2005/0018505 A1 | 1/2005 | Wallace |
| 2005/0035440 A1 | 2/2005 | Mohammed |
| 2005/0040508 A1 | 2/2005 | Lee |
| 2005/0085034 A1 | 4/2005 | Akiba et al. |
| 2005/0108468 A1 | 5/2005 | Hazelzet et al. |
| 2005/0133897 A1 | 6/2005 | Baek et al. |
| 2005/0156297 A1 | 7/2005 | Farnworth et al. |
| 2005/0245060 A1 | 11/2005 | Chiu |
| 2006/0033217 A1 | 2/2006 | Taggart et al. |
| 2006/0049504 A1 * | 3/2006 | Corisis et al. ............ 257/686 |
| 2006/0050498 A1 | 3/2006 | Cady et al. |
| 2006/0050592 A1 | 3/2006 | Cady et al. |
| 2006/0055024 A1 | 3/2006 | Wehrly |
| 2006/0087013 A1 | 4/2006 | Hsieh |
| 2006/0091521 A1 | 5/2006 | Cady et al. |
| 2006/0192277 A1 * | 8/2006 | RaghuRam ............ 257/686 |
| 2006/0261449 A1 * | 11/2006 | Rapport et al. ............ 257/666 |
| 2008/0050859 A1 * | 2/2008 | Wallace ............ 438/123 |

OTHER PUBLICATIONS

Koh, W., "A System in Package Technology Applications," IEEE 2005 6th International Conference on Electronic Packaging Technology [retrieved Oct. 22, 2007] Retrieved from the Internet. <URL: http://ieeexplore.ieee.org/xpl/freeabs_all.jsp?arnumber=1564753>, entire doc (especially p. 3, col. 1, para 1-2 and fig 3-4, 6-8, 14).
PCT/US07/64407 International Search Report and Written Opinion, PCT, Feb. 25, 2008.
PCT/US07/65009 International Search Report and Written Opinion, PCT, Mar. 4, 2008.

* cited by examiner

STACKED INTEGRATED CIRCUIT MODULE

TECHNICAL FIELD

This invention relates to stacking leaded integrated circuit devices and, in particular, to stacks and stacking integrated circuits in leaded packages.

BACKGROUND

A variety of systems and techniques are known for stacking packaged integrated circuits. Some techniques are devised for stacking chip-scale packaged devices (CSPs) while other systems and methods are better directed to leaded packages such as those that exhibit a set of leads extending from at least one lateral side of a typically rectangular package.

Memory devices are packaged in both chip-scale (CSP) and leaded packages. However, techniques for stacking CSP devices are typically not optimum for stacking leaded devices. Although CSP devices are gaining market share, in many areas, integrated circuits continue to be packaged in high volumes in leaded packages. For example, the well-known flash memory integrated circuit is typically packaged in a leaded package with fine-pitched leads emergent from one or both sides of the package. A common package for flash memory is the thin small outline package commonly known as the TSOP typified by leads emergent from one or more (typically a pair of opposite sides) lateral sides of the package.

The assignee of the present invention, Staktek Group L.P., has developed a wide variety of techniques, systems and designs for stacks and stacking with both leaded and CSP devices. In leaded package stacking, Staktek Group L.P. has developed, for example, U.S. Pat. No. 6,572,387 issued Jun. 3, 2003 and U.S. patent application Ser. No. 10/449,242 published as Pub. No. 2003/0203663 A1 which disclose and claim various techniques and apparatus related to stacking leaded packages.

Many other techniques have been developed for interconnecting the leads of the stacked devices. For example, U.S. Pat. No. 4,696,525 to Coller et al. purports to teach a socket connector for coupling adjacent devices in a stacked configuration to one another. The socket has external conductors that interconnect leads from like, adjacent devices to one another. Sockets, however, are limited in several respects. They are not versatile in their ability to implement complex interconnections. In addition, such sockets, which have relatively thick, plastic bodies, act as thermal insulators between upper and lower package surfaces, and inhibit the module's overall ability to dissipate heat.

Although the art has many techniques for stacking leaded devices, a new system and method for stacking leaded package devices is a welcome development. Accordingly, the present application discloses improved systems and methods for electrically and thermally coupling adjacent integrated circuit devices in stacked modules.

SUMMARY OF THE INVENTION

The present invention provides a system and method for stacks and stacking leaded package ICs packages. A flex circuit is disposed between leaded ICs to be stacked. In a preferred embodiment, leads of constituent leaded IC packages are configured to allow the lower surface of the leaded IC packages to contact the surface of the flex circuitry that provides connection between an upper and lower leaded IC package. In an optional embodiment, a part of the flex circuit emerges from between the leaded ICs and provides a connective facility for connection to external or application environments.

DETAILED DESCRIPTION

Figure 1:
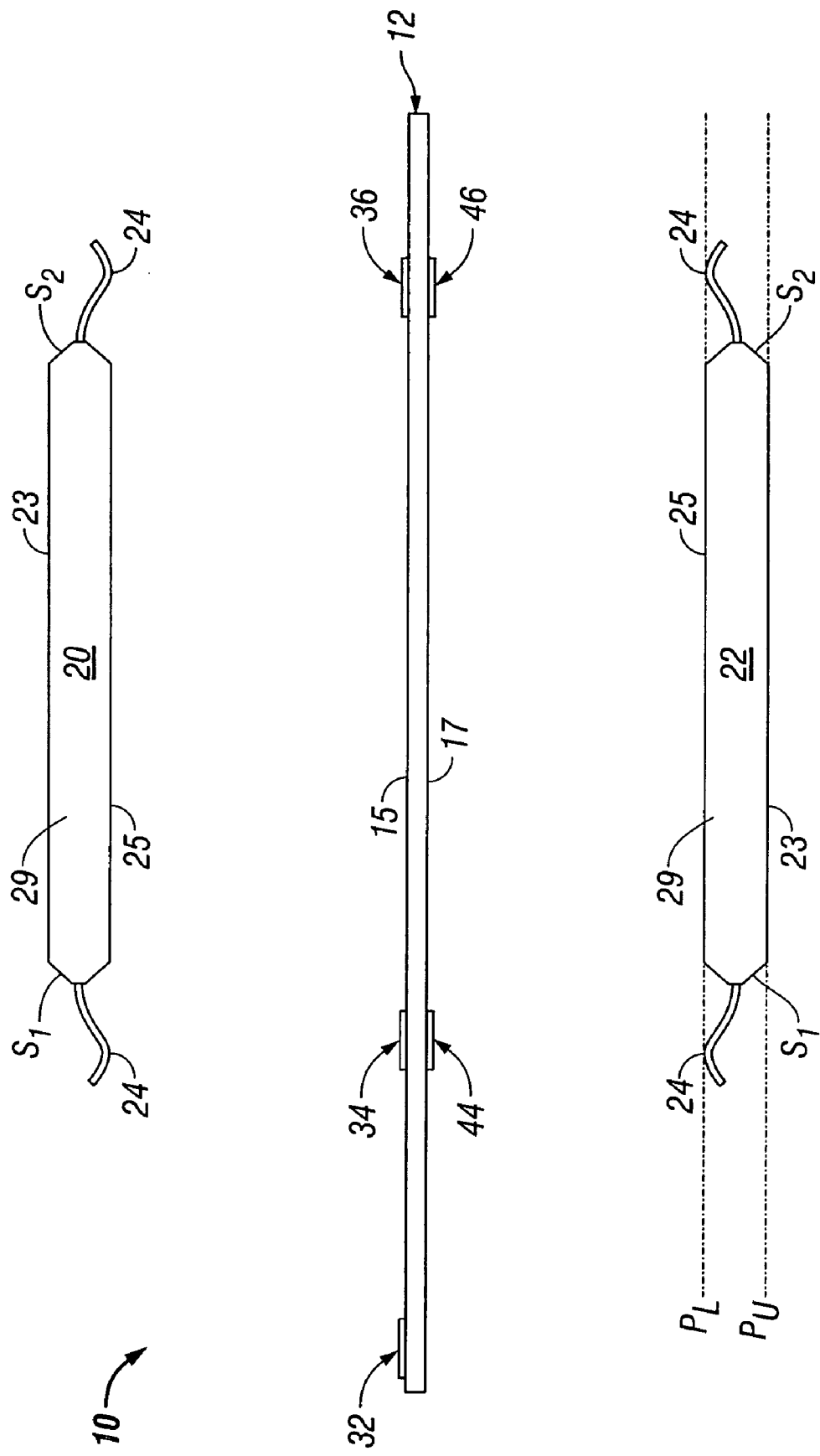
FIG. 1 is an exploded view of a stacked module devised in accordance with a preferred embodiment of the present invention.

FIG. 1 is an exploded view of an exemplar stacked module 10 devised in accordance with a preferred embodiment of the present invention. Exemplar module 10 is comprised of leaded ICs 20 and 22 each having upper and lower sides or surfaces 23 and 25, respectively, and lateral sides S1 and S2 which, as those of skill will recognize, may be in the character of edges or sides and need not be perpendicular in aspect to the upper and lower surfaces 23 and 25. Leads 24 are emergent from sides S1 and S2. In a preferred embodiment, leads 24 are deflected to remain within the space defined by planes PL and PU defined by lower surfaces 25 and 23 respectively of the respective ICs to allow the lower surfaces 25 of each of the respective leaded packaged ICs to be in contact with the respective surfaces 15 and 17 of flex circuit 12 when the ICs are connected to the flex. In this disclosure, contact between the lower surface 25 of a leaded IC and the surfaces of flex circuit 12 includes not only direct contact between surface or side 25 and flex but shall include those instances where intermediate materials such as adhesive is used between the respective leaded IC and flex.

The present invention may also be employed with circuitry other than or in addition to memory such as the flash memory depicted in a number of the present FIGS. Other exemplar types of circuitry that may be aggregated in stacks in accordance with embodiments of the invention include, just as non-limiting examples, DRAMs, FPGAs, and system stacks that include logic and memory as well as communications or graphics devices. It should be noted, therefore, that the depicted profile for ICs 20 and 22 is not a limitation and that upper and lower leaded ICs 20 and 22 respectively need not be TSOPs or TSOP-like and the packages employed may have more than one die or leads emergent from one, two, three or all sides of the respective package body. For example, a module 10 in accordance with embodiments of the present invention may employ leaded ICs 20 and 22 that have more than one die within each package and may exhibit leads emergent from only one side of the package. In such cases, adhesives will typically be employed between the IC and flex circuit. Further, a module 10 in accord with the present invention need not have two ICs as the invention may be employed to devise a stacked module 10 with two or more ICs as those of skill will understand after appreciating this disclosure. Further, techniques disclosed herein may be employed to stack a leaded IC in a leaded-CSP combination stack.

In the depicted preferred embodiment, flex circuit 12 (e.g., "flex", "flex circuitry", "flexible circuit" etc.) is disposed between leaded ICs 20 and 22 and exhibits a first side 15 having two pluralities of connective sites 34 and 36 adapted for connection to a leaded IC and, in this embodiment, another optional plurality of connective sites 32. Flex circuit 12 also exhibits a second side 17 having two pluralities of connective sites 44 and 46. Those of skill will recognize that flex circuit 12 may be comprised from traditional flexible circuitry or, in some of the alternative embodiments, what is sometimes called rigid-flex may be employed. Such rigid flex exhibits rigid areas and flexible areas to provide an interconnection function required of flex circuit 12 in the present invention.

Pluralities 34 and 36 and 44 and 46 of connective sites are adapted for connection to the leads of leaded packages IC 20 and IC 22, respectively, each of which has a plurality of peripheral sides, individual ones of which sides are identified as S1 and S2. Optional third plurality of connective sites 32 is adapted for connection of module 10 to an external circuit or environment.

Plural leads 24 are emergent from at least one of the plural sides of the ICs and typically, a plurality of leads 24 is emergent from one of the plural sides of each of the ICs 20 and 22 and a second plurality of leads 24 is emergent from another one of the plural sides of each of ICs 20 and 22. Leaded ICs 20 and 22 are connected to flex circuit 12 through the leads 24 of leaded ICs 20 and 22. As those of skill will recognize, many techniques exist for connecting the leads of leaded ICs 20 and 22 to the connective sites. Such techniques include, as a non-limiting example, use of solder or other conductive attachment. Other forms of bonding other than solder between the connecting sites and leads 24 may also be employed (such as brazing or welding for example) but soldering techniques are well understood and adapted for use in large scale manufacturing.

Figure 2:
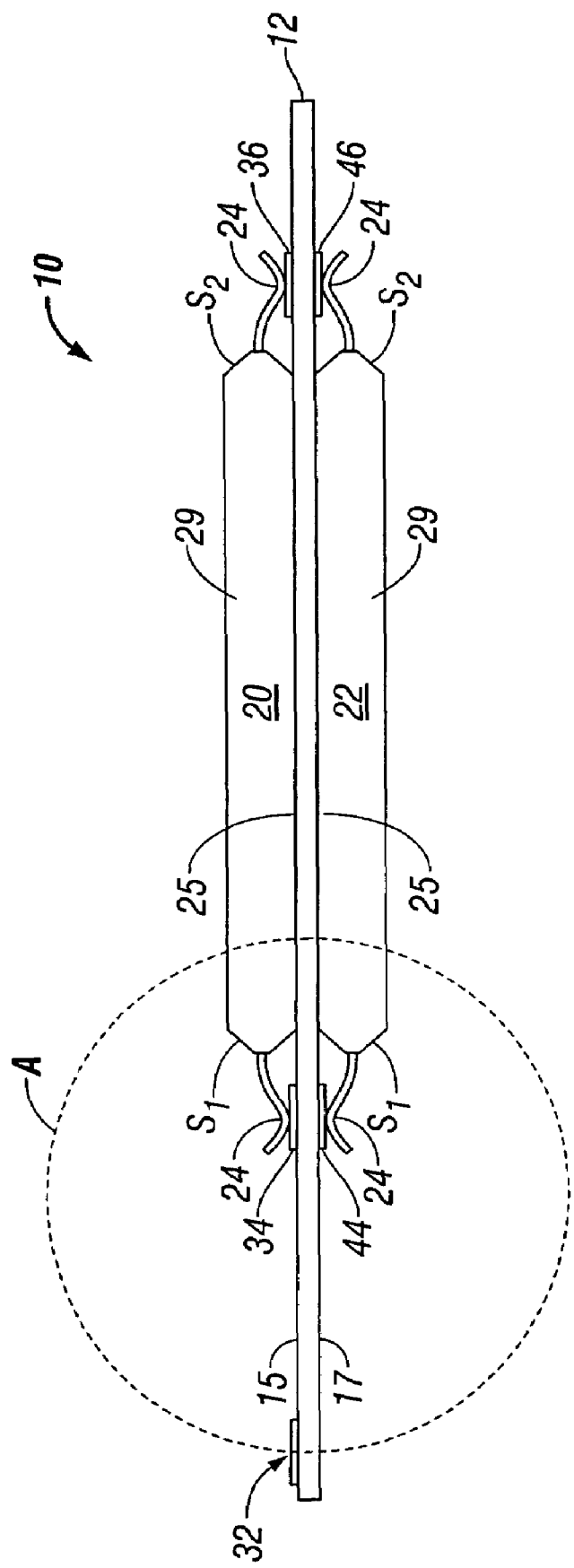
FIG. 2 is a side view of a stacked module devised in accordance with a preferred embodiment of the present invention.

FIG. 2 depicts a side perspective view of a stacked module 10 devised in accordance with a preferred embodiment of the present invention. As depicted, lower side 25 of each of leaded ICs 20 and 22 are adjacent to sides 15 and 17 respectively, of flex circuit 12. To realize the adjacent and, preferably, contact (touching) relationship between the lower side 25 of a selected leaded IC and the respective flex circuit side, leads 24 typically require modification or reconfiguration which is preferably performed before mounting of the leaded IC to flex circuit 12. Those of skill will note that a preferred method for reconfiguration of leads 24 comprises use of a jig to fix the position of body 29 of the respective leaded IC and, preferably, support the lead at the point of emergence from the body at sides S1 and S2 of leaded ICs 20 and 22 before deflection of the respective leads toward the upper plane PU to confine leads 24 to the space between planes PL and PU of the respective leaded IC as earlier shown in FIG. 1. This is because typically, leaded ICs such as TSOPs are configured with leads that extend beyond the lower plane PL. In order for the lower surface 25 of the respective leaded packaged ICs to contact (either directly or through an adhesive or thermal intermediary) the respective surfaces of the flex circuit, the leads 24 must be typically reconfigured.

Figure 3:
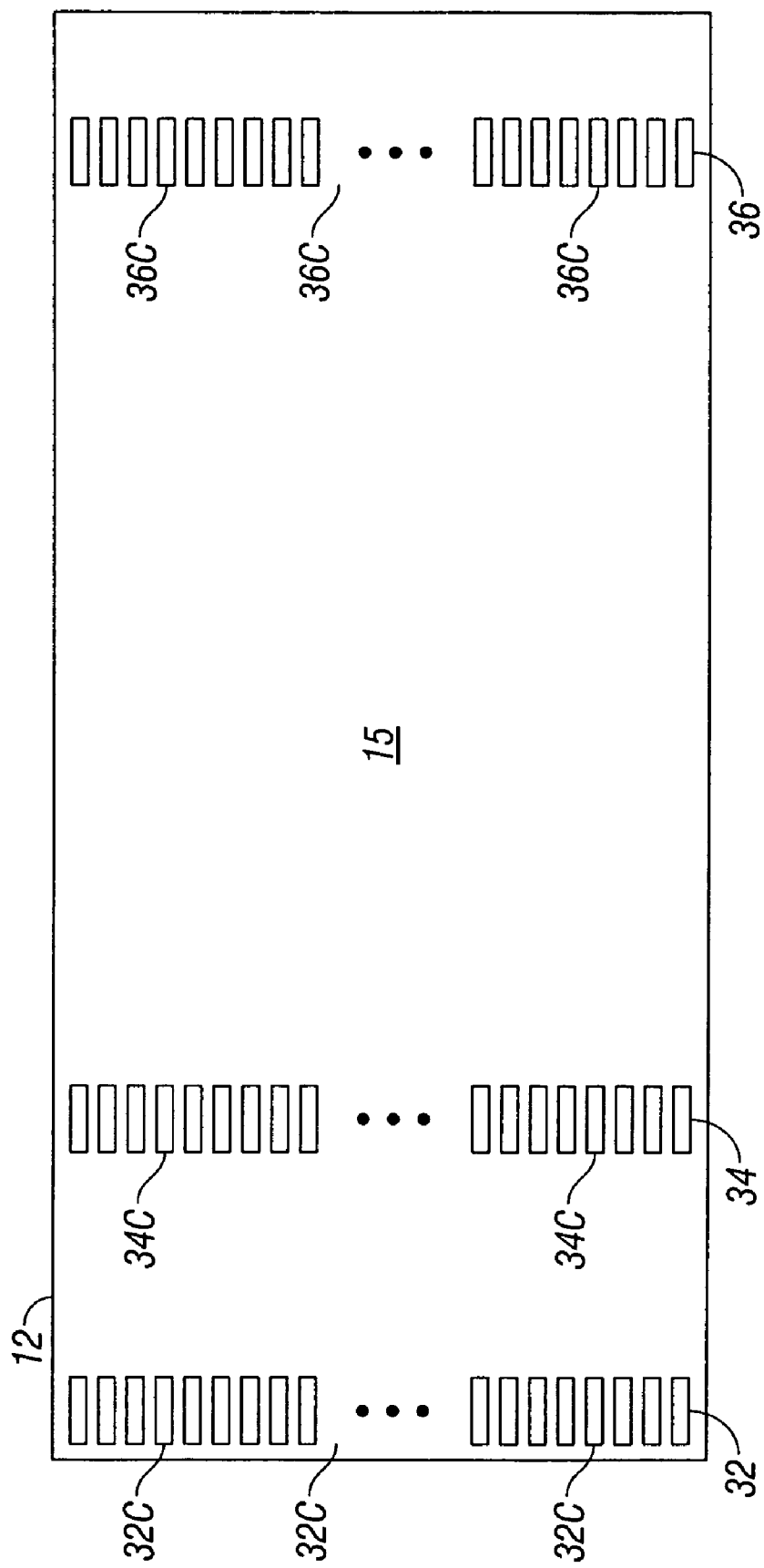
FIG. 3 is a plan view of one side of a flex circuit in accordance with an embodiment of the present invention.

FIG. 3 depicts a plan view of side 15 of the flex circuit. As depicted, side 15 exhibits three pluralities of connective sites, 32, 34, and 36, each comprised of individual connective sites 32C, 34C, and 36C, respectively. First and second pluralities 34 and 36 are adapted for connection to leaded IC 20 through leads 24, with optional plurality of connective sites 32 being adapted for connecting module 10 to an external circuit or environment.

Figure 4:
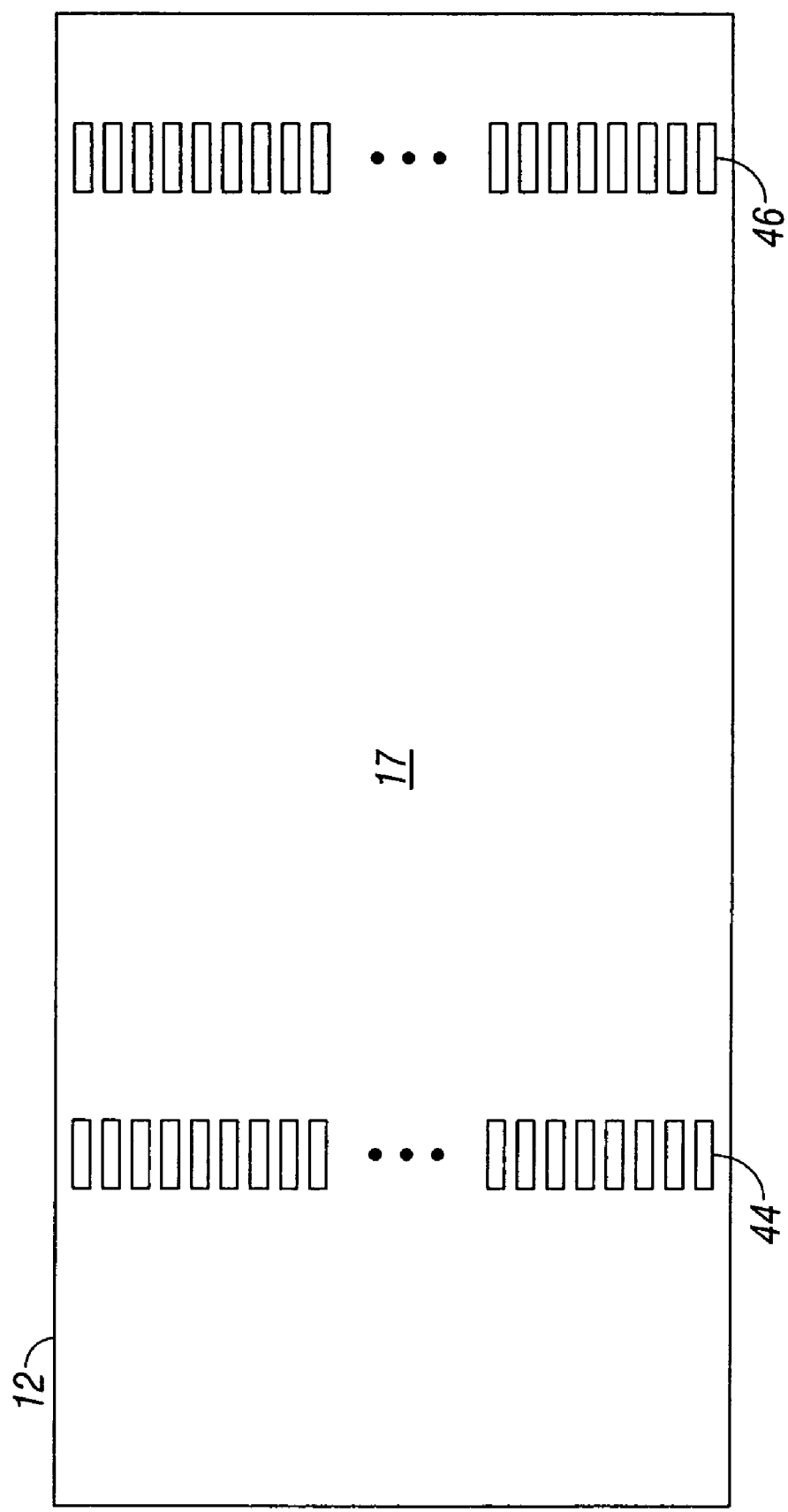
FIG. 4 is a plan view of another side of a flex circuit in accordance with an embodiment of the present invention.

FIG. 4 depicts a plan view of side 17 of flex circuit 12. As depicted, side 17 exhibits two pluralities of connective sites 44 and 46 respectively, each comprised of multiple connective sites 44C and 46C, respectively, these sites being adapted for connection to leaded IC 22 through leads 24.

Figure 5:
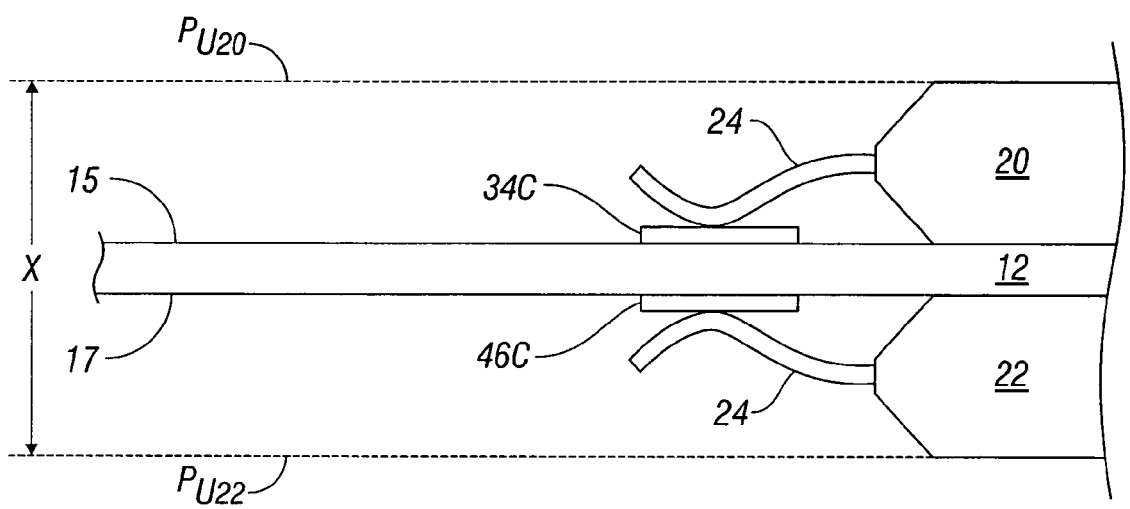
FIG. 5 depicts the area marked "A" in FIG. 2.

FIG. 5 depicts the area identified by "A" in earlier FIG. 2. As depicted, the standard lead shape is modified or reconfigured to reduce the profile X of module 10 as lower surfaces 25 of leaded ICs 20 and 22 are adjacent to and, preferably, in contact with surfaces 15 and 17, respectively, of flex circuit 12. Profile X is the distance between respective upper planes PU20 and PU22. Leads 24 of leaded ICs 20 and 22 are preferably configured to allow leaded ICs 20 and 24 to be in either direct or indirect (through intermediary adhesive for example) contact with flex 12.

Leads 24 of leaded ICs 20 and 22 employed in an exemplar module 10 are shown in contact with connective sites 34C and 44C, for example, while lower surface 25 of the leaded ICs 20 and 22 are in contact with the respective sides 15 and 17 of flex circuit 12.

Figure 6:
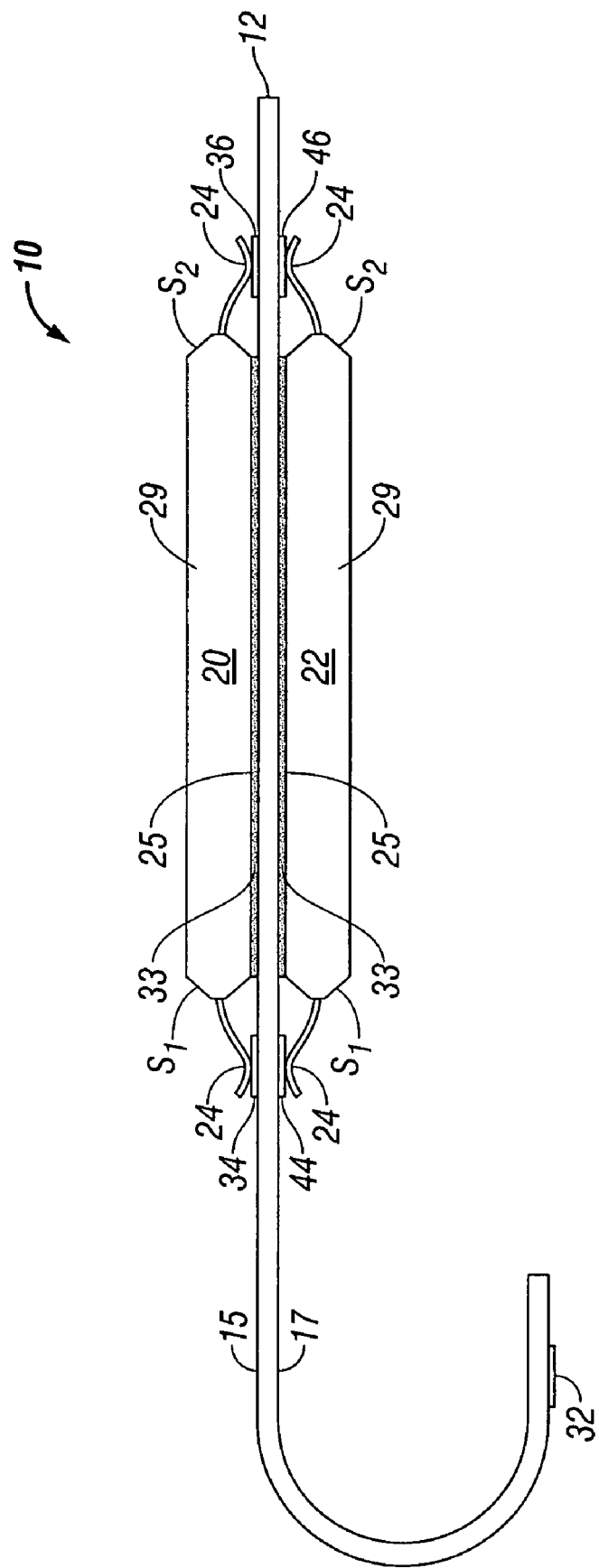
FIG. 6 is a side view of a stacked module in accordance with an alternative preferred embodiment of the present invention.

FIG. 6 depicts an exemplar module 10 having connective sites 32 for connection to an external circuit or environment. Those of skill will recognize that when a third plurality of connective sites such as the depicted reference 32 are employed, they may be disposed on either side 15 or 17 of flex circuit 12. In this depiction, adhesive 33 is shown between lower surfaces 25 and respective sides of flex circuit 12.

Figure 7:
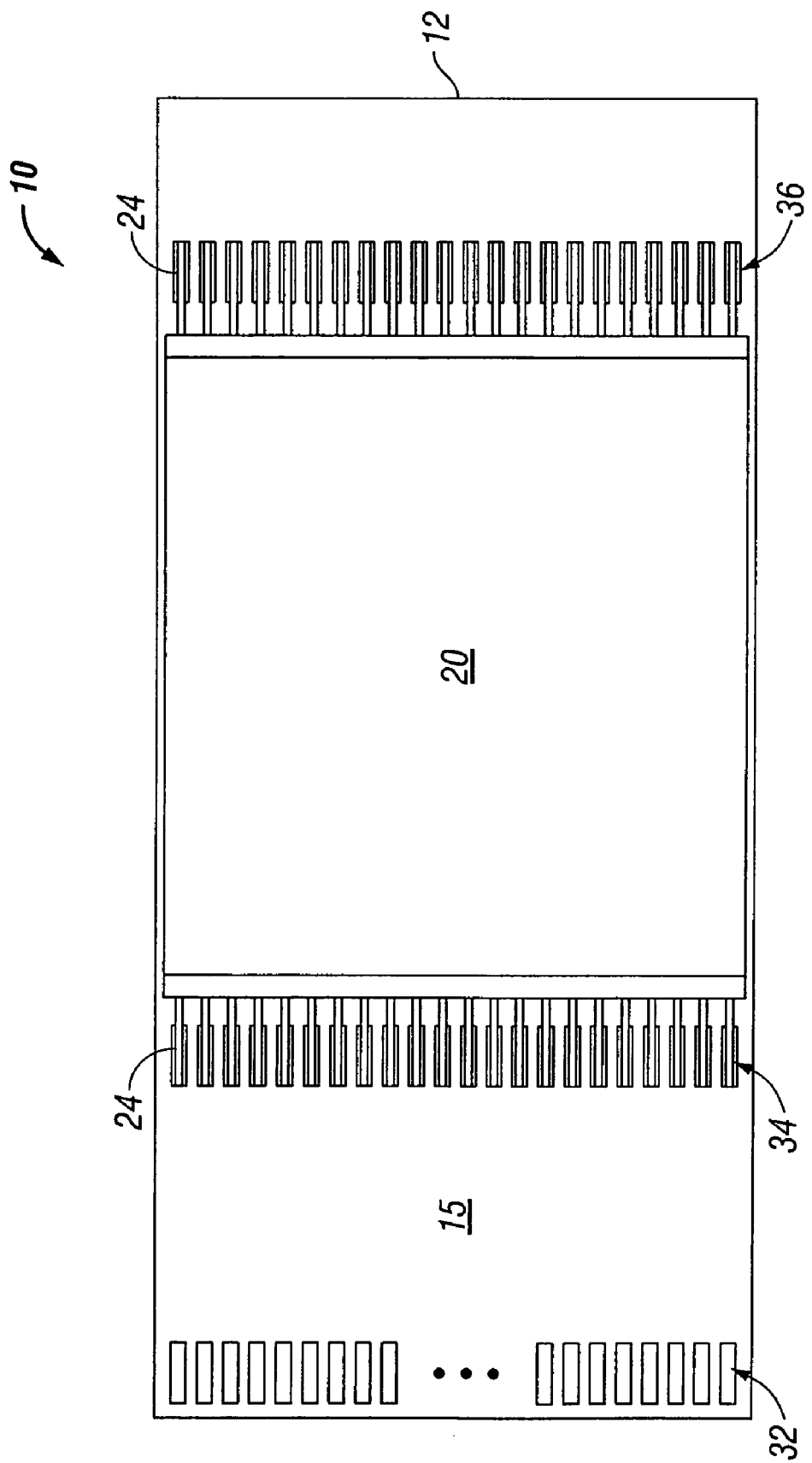
FIG. 7 is a plan view of a stacked module in accordance with an alternative preferred embodiment of the present invention.

FIG. 7 illustrates that, in devising a module in accordance with the present invention, some embodiments may be constructed where connective sites 32 take the form of edge connector pads for connection with an edge connector such as, for example, those typically found in computer applications for memory expansion.

Figure 8:
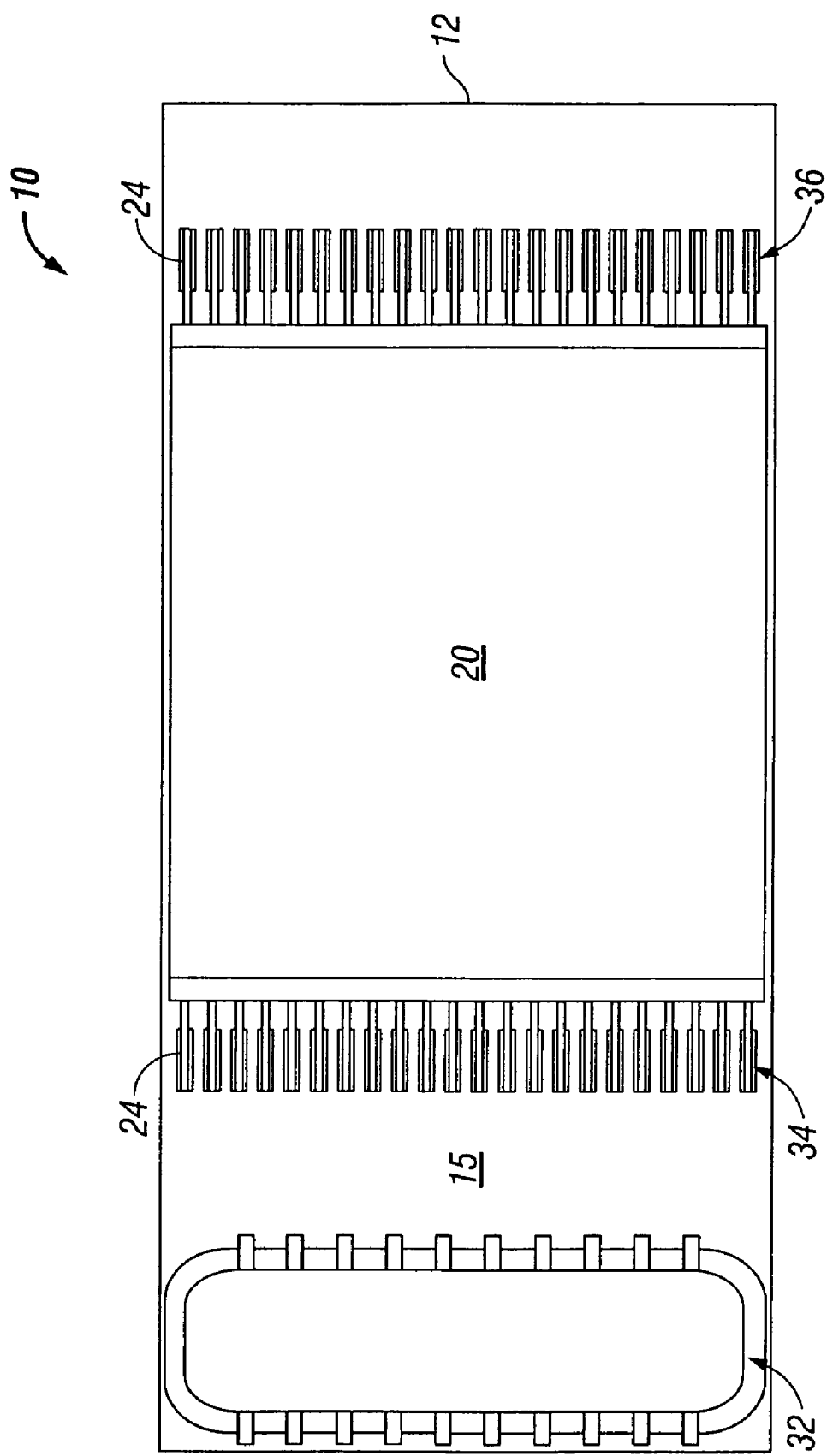
FIG. 8 is a plan view of a stacked module in accordance with another alternative preferred embodiment of the present invention.

FIG. 8 illustrates a plan view of an exemplar module 10 in accordance with an alternative preferred embodiment of the present invention. FIG. 8 employs a socket connector as the third plurality of connective sites 32 for connecting stacked module 10 to an external circuit or environment.

Figure 9:
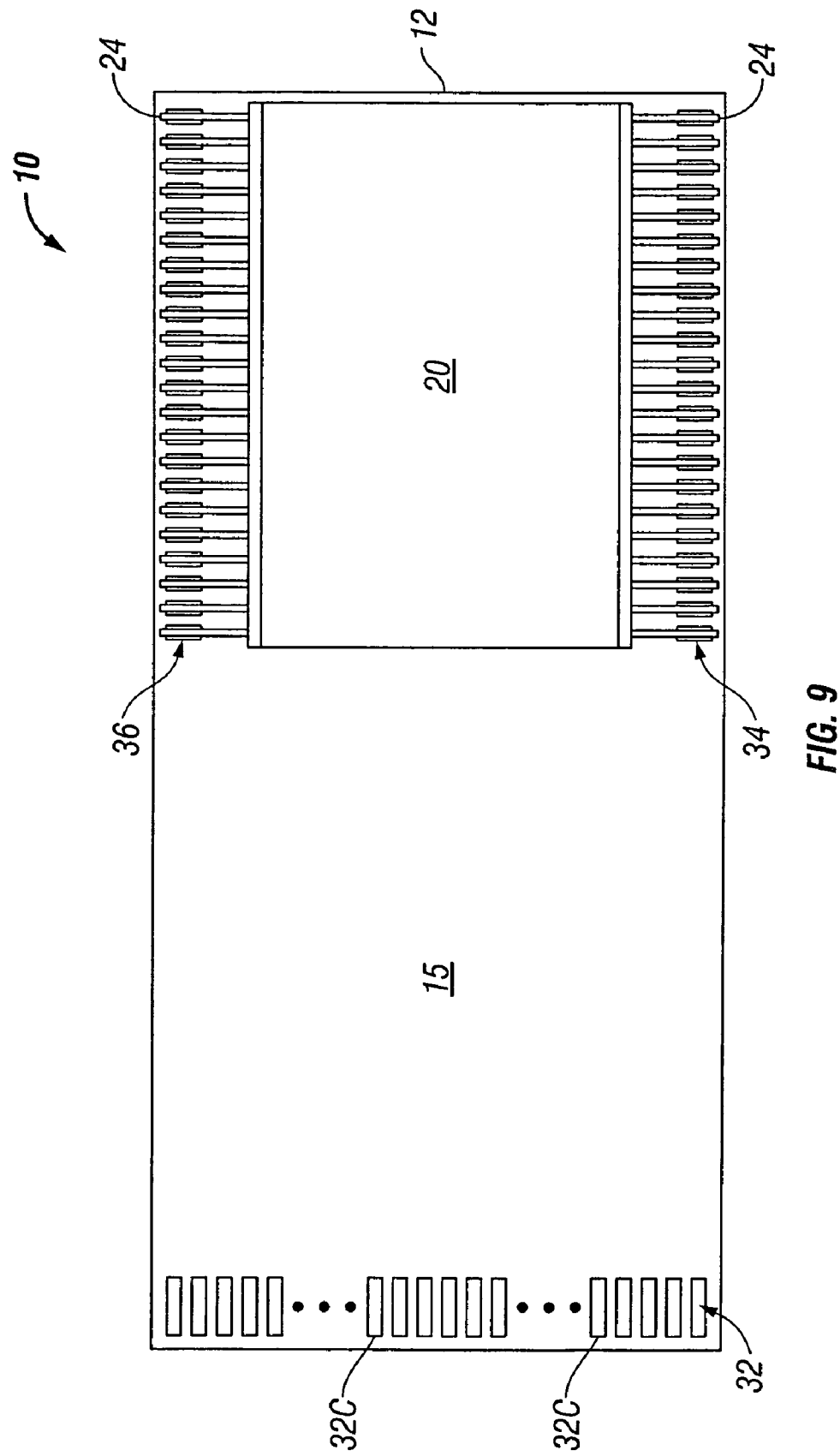
FIG. 9 is a plan view of a stacked module in accordance with another alternative preferred embodiment of the present invention.

FIG. 9 illustrates a module 10 in accordance with an alternative preferred embodiment of the present invention, showing alternative arrangements of the pluralities of connection sites on side 15 of the flex circuit. In the depiction of FIG. 9, the first and second pluralities of connective sites are oriented in a first direction while the third plurality of connective sites for connection of the circuit module to an application environment are oriented in a direction perpendicular to the orientation of the first and second pluralities of connective sites.

Figure 10:
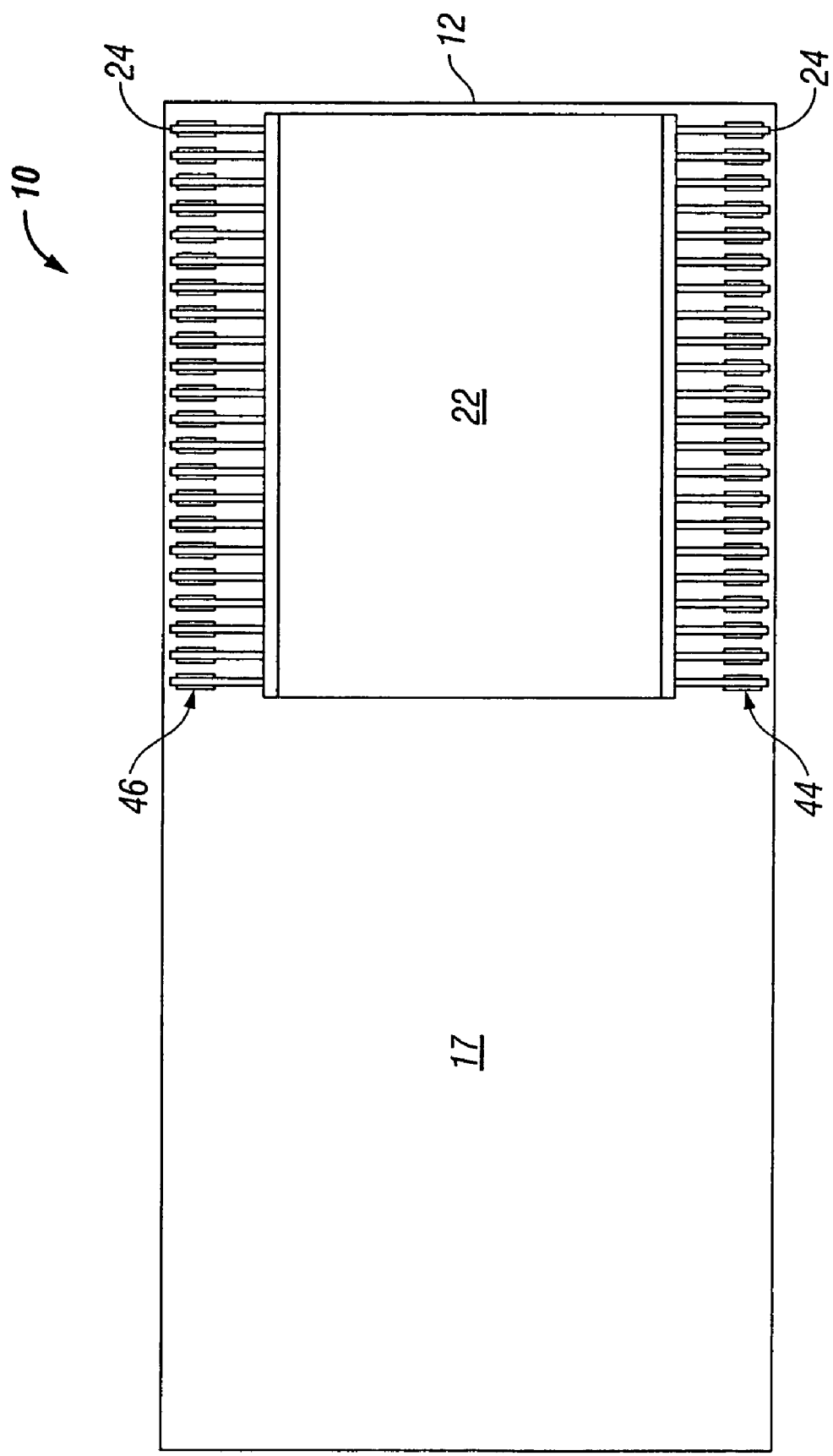
FIG. 10 is a plan view of another side of a stacked module in accordance with another alternative preferred embodiment of the present invention.

FIG. 10 is a plan view of another side of the stacked module depicted in FIG. 9, sharing alternative arrangements of the pluralities of connective sites on side 17 of the flex circuit.

It will be seen by those skilled in the art that many embodiments taking a variety of specific forms and reflecting changes, substitutions, and alternations can be made without departing from the spirit and scope of the invention. Therefore, the described embodiments illustrate but do not restrict the scope of the claims.

The invention claimed is:

1. A circuit module comprising:
    a flexible circuit having first and second sides each of which sides exhibits first and second pluralities of connective sites, the first and second pluralities of connective sites being adapted for connection to leads of leaded packaged ICs;
    first and second leaded packaged ICs, each one of which has an upper and a lower major surface and plural peripheral sides, a first plurality of leads emergent from a first one of the plural peripheral sides of each of the respective leaded packaged ICs, the first plurality of leads of the first leaded packaged IC being directly connected to the first plurality of connective sites of the first side of the flex circuit while the lower surface of the first leaded packaged IC is immediately adjacent to and in contact with the first side of the flex circuit and the first plurality of leads of the second leaded packaged IC being directly connected to the first plurality of connective sites of the second side of the flex circuit while the lower surface of the second leaded packaged IC is immediately adjacent to and in contact with the second side of the flex circuit.

2. The circuit module of claim 1 further comprising a second plurality of leads emergent from a second one of the plural peripheral sides of each of the respective first and second leaded packaged ICs and the second plurality of leads of the first leaded packaged IC being connected to the second plurality of connective sites of the first side of the flex circuit and the second plurality of leads of the second leaded packaged IC being connected to the second plurality of connective sites of the second side of the flex circuit.

3. The circuit module of claims 1 or 2 in which the flex circuit emerges from between the first and second leaded packaged ICs and exhibits a third plurality of connective sites for connection of the circuit module to an application environment.

4. The circuit module of claim 3 in which the third plurality of connective sites is adapted for connection to a printed circuit board.

5. The circuit module of claim 3 in which the third plurality of connective sites is adapted for connection to a socket connector.

6. The circuit module of claims 1, 2, 3, 4 or 5 in which the first and second leaded packaged ICs are flash memory devices.

7. The circuit module of claim 1 in which the leads of each of the first and second leaded packaged ICs are reconfigured before connection to the flex circuit so as to confine the lead in a space defined by first and second planes defined by the upper and lower major surfaces of the first and second leaded packaged ICs respectively.

8. A circuit module comprising:
    first and second leaded packaged ICs, each of which has an upper major surface defining a plane PU and a lower major surface defining a plane PL and plural peripheral sides, a first one of said plural peripheral sides having an emergent first plurality of leads and a second one of said plural peripheral sides having an emergent second plurality of leads, the first plurality of leads having been configured to be within the space defined by PL and PU;
    a flex circuit disposed between the first and second packaged ICs and emergent in part from between the first and second packaged ICs, the flex circuit having first and second pluralities of connective sites along each of first and second major flex surfaces and a third plurality of connective sites along the flex circuit, the first leaded packaged IC being directly connected to the first and second connective sites along the first major flex surface through the first and second pluralities of leads, respectively, of the first leaded packaged IC and there being contact between the lower major surface of the first leaded packaged IC and the first major flex surface of the flex circuit and the second leaded packaged IC being directly connected to the first and second connective sites along the second major flex surface through the first and second pluralities of leads, respectively, of the second leaded packaged IC and there being contact between the lower major surface of the second leaded packaged IC and the second major flex surface of the flex circuit.

9. The circuit module of claim 8 in which an adhesive is disposed between the lower major surface of the first leaded packaged IC and the first major surface of the flex circuit.

10. The circuit module of claim 8 in which an adhesive is disposed between the lower major surface of the second leaded packaged IC and the second major surface of the flex circuit.

11. The circuit module of claims 8, 9, or 10 in which the first and second leaded packaged ICs are flash memory circuits.

12. The circuit module of claim 8 in which the first and second pluralities of connective sites are oriented in a first direction and the third-plurality of connective sites are oriented in a second direction different from the first direction.

13. The circuit module of claim 8 in which the third plurality of connective sites is configured for connection to an edge connector.

14. The circuit module of claim 8 in which the third plurality of connective sites are configured as a socket connector.

* * * * *

UNITED STATES PATENT AND TRADEMARK OFFICE
CERTIFICATE OF CORRECTION

PATENT NO. : 7,508,058 B2
APPLICATION NO. : 11/330307
DATED : March 24, 2009
INVENTOR(S) : James Douglas Wehrly, Jr.

It is certified that error appears in the above-identified patent and that said Letters Patent is hereby corrected as shown below:

In Claim 7, Column 6, Line 1, delete "firstand" and insert -- first and --, therefor.

In Claim 10, Column 6, Line 37, delete "secondmajor" and insert -- second major --, therefor.

In Claim 12, Column 6, Line 44, delete "third-plurality" and insert -- third plurality --, therefor.

Signed and Sealed this

Fourteenth Day of July, 2009

JOHN DOLL
*Acting Director of the United States Patent and Trademark Office*